United States Patent
Kim et al.

(10) Patent No.: US 8,847,377 B2
(45) Date of Patent: Sep. 30, 2014

(54) STACKED WAFER LEVEL PACKAGE HAVING A REDUCED SIZE

(75) Inventors: Jong Hoon Kim, Gyeonggi-do (KR); Min Suk Suh, Seoul (KR); Seung Taek Yang, Seoul (KR); Seung Hyun Lee, Gyeonggi-do (KR); Tae Min Kang, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 208 days.

(21) Appl. No.: 13/569,600

(22) Filed: Aug. 8, 2012

(65) Prior Publication Data

US 2012/0299169 A1 Nov. 29, 2012

Related U.S. Application Data

(60) Continuation-in-part of application No. 13/158,813, filed on Jun. 13, 2011, now abandoned, which is a division of application No. 12/048,695, filed on Mar. 14, 2008, now abandoned.

(30) Foreign Application Priority Data

Jan. 2, 2008 (KR) .................. 10-2008-0000317

(51) Int. Cl.
*H01L 23/02* (2006.01)
*H01L 21/683* (2006.01)
*H01L 21/56* (2006.01)
(Continued)

(52) U.S. Cl.
CPC ... *H01L 25/0652* (2013.01); *H01L 2224/13024* (2013.01); *H01L 2924/01033* (2013.01);
(Continued)

(58) Field of Classification Search
CPC ............. H01L 2924/00; H01L 2224/32225; H01L 2224/48227; H01L 2224/73265; H01L 2924/15311; H01L 2224/48091; H01L 2924/00014; H01L 2224/97; H01L 2224/73215; H01L 2224/4824; H01L 2224/32145
USPC .................................. 257/686, 668, E25.018
See application file for complete search history.

(56) References Cited

U.S. PATENT DOCUMENTS 6,580,618 B2 6/2003 Pu
6,621,169 B2 9/2003 Kikuma et al.
(Continued)

FOREIGN PATENT DOCUMENTS

CN 1579020 A 2/2005
CN 1652334 A 8/2005
(Continued)

OTHER PUBLICATIONS

USPTO RR mailed Jul. 20, 2010 in connection with U.S. Appl. No. 12/048,695.
(Continued)

*Primary Examiner* — Duy T Nguyen
(74) *Attorney, Agent, or Firm* — Ladas & Parry LLP

(57) ABSTRACT

A stacked wafer level package includes a first semiconductor chip having a first bonding pad and a second semiconductor chip having a second bonding pad. Both bonding pads of the semiconductor chips face the same direction. The second semiconductor chip is disposed in parallel to the first semiconductor chip. A third semiconductor chip is disposed over the first and second semiconductor chips acting as a supporting substrate. The third semiconductor chip has a third bonding pad that is exposed between the first and the second semiconductor chips upon attachment. Finally, a redistribution structure is electrically connected to the first, second, and third bonding pads.

11 Claims, 14 Drawing Sheets

(51) Int. Cl.
*H01L 23/538* (2006.01)
*H01L 25/00* (2006.01)
*H01L 25/065* (2006.01)
*H01L 23/31* (2006.01)
H01L 23/00 (2006.01)
H01L 25/18 (2006.01)

(52) U.S. Cl.
CPC ... *H01L 21/6835* (2013.01); *H01L 2924/01023* (2013.01); *H01L 24/13* (2013.01); *H01L 2924/15311* (2013.01); *H01L 21/568* (2013.01); *H01L 24/96* (2013.01); *H01L 23/5389* (2013.01); *H01L 2225/06562* (2013.01); *H01L 2224/12105* (2013.01); *H01L 25/18* (2013.01); *H01L 25/50* (2013.01); *H01L 2221/68345* (2013.01); *H01L 2924/01029* (2013.01); *H01L 25/0657* (2013.01); *H01L 24/20* (2013.01); *H01L 2224/97* (2013.01); *H01L 24/19* (2013.01); *H01L 2924/01059* (2013.01); *H01L 2924/01024* (2013.01); *H01L 2924/014* (2013.01); *H01L 23/3114* (2013.01); *H01L 2224/131* (2013.01); *H01L 21/565* (2013.01); *H01L 2224/221* (2013.01); *H01L 2924/01078* (2013.01); *H01L 2224/2105* (2013.01); *H01L 2924/18161* (2013.01)
USPC .................................. 257/686; 257/E25.018

(56) References Cited

U.S. PATENT DOCUMENTS

| | | | |
|---|---|---|---|
| 6,707,141 | B2 | 3/2004 | Akram |
| 7,126,219 | B2 | 10/2006 | Hsieh et al. |
| 2002/0053727 | A1* | 5/2002 | Kimura ..................... 257/686 |
| 2004/0089464 | A1 | 5/2004 | Yamada |
| 2004/0164390 | A1 | 8/2004 | Wang |
| 2005/0001329 | A1 | 1/2005 | Matsuki et al. |
| 2005/0121765 | A1 | 6/2005 | Lin |
| 2007/0228563 | A1 | 10/2007 | Han |

FOREIGN PATENT DOCUMENTS

| | | |
|---|---|---|
| CN | 101038908 A | 9/2007 |
| JP | 2005-294724 A | 10/2005 |
| KR | 1020040061608 A | 7/2004 |
| KR | 1020040071177 A | 8/2004 |
| KR | 1020040094165 A | 11/2004 |

OTHER PUBLICATIONS

USPTO NFOA mailed Oct. 13, 2010 in connection with U.S. Appl. No. 12/048,695.

USPTO FOA mailed Feb. 11, 2011 in connection with U.S. Appl. No. 12/048,695.

USPTO Notice of Abandonment mailed Sep. 23, 2011 in connection with U.S. Appl. No. 12/048,695.

USPTO RR mailed Oct. 17, 2011 in connection with U.S. Appl. No. 13/158,813.

USPTO NFOA mailed Dec. 30, 2011 in connection with U.S. Appl. No. 13/158,813.

USPTO FOA mailed May 9, 2012 in connection with U.S. Appl. No. 13/158,813.

Chinese Office Action dated Mar. 20, 2014; Appln. No. 201210210493.2.

* cited by examiner

STACKED WAFER LEVEL PACKAGE HAVING A REDUCED SIZE

CROSS-REFERENCE TO RELATED APPLICATIONS

The present continuation in part application claims priority to Korean patent application number 10-2008-0000317 filed on Jan. 2, 2008, and claims priority to a divisional application of U.S. patent application Ser. No. 12/048,695 filed on Mar. 14, 2008, and claims priority to U.S. patent application Ser. No. 13/158,813 filed on Jun. 13, 2011, in which all of these applications are incorporated herein by reference in their entireties.

BACKGROUND OF THE INVENTION

The present invention relates generally to a wafer level package.

Recently, with developments in semiconductor fabrication technology, various kinds of semiconductor packages have been developed having semiconductor devices that are suitable for processing more data in a short time.

In order to improve data storage capacity and data processing speed of the semiconductor package, a stacked semiconductor package has been recently developed in which a plurality of semiconductor chips is stacked.

Conductive wires or through-electrodes, which pass through the semiconductor chips, are necessary to electrically connect the plurality of semiconductor chips included in the stacked semiconductor package.

When the semiconductor chips of the stacked semiconductor package are electrically connected using conductive wires, the size of the stacked semiconductor package is increased greatly due to the use of the conductive wires.

When the semiconductor chips are electrically connected using the through electrodes, the fabrication process becomes more complicated and a defective manufacturing rate is greatly increased since via holes are formed in the semiconductor chips.

SUMMARY OF THE INVENTION

Embodiments of the present invention are directed to a stacked wafer level package in which a plurality of semiconductor chips are stacked without using conductive wires or through electrodes and a substrate.

In one embodiment, a stacked wafer level package comprises a first semiconductor chip having a first bonding pad; a second semiconductor chip disposed in parallel to the first semiconductor chip and having a second bonding pad directed in the same direction as the first bonding pad; a third semiconductor chip disposed over the first and the second semiconductor chips and having a third bonding pad exposed between the first and the second semiconductor chips; and a redistribution structure electrically connected with the first bonding pad, the second bonding pad and the third bonding pad.

The stacked wafer level package may further comprise an adhesive member interposed between the first and second semiconductor chips and the third semiconductor chip.

The stacked wafer level package may further comprise a plate shaped molding member having a through hole into which the third semiconductor chip is inserted.

At least one of the first through third semiconductor chips is a different kind from the others.

The first and second bonding pads are disposed at the center portions of the first and second semiconductor chips respectively.

Alternatively, the first and second bonding pads may be disposed at the edge portions of the first and second semiconductor chips respectively.

The first and second bonding pads are disposed over substantially the same plane.

The redistribution structure includes a first insulation layer pattern covering the first and second semiconductor chips and having first openings for exposing the first through third bonding pads; a first redistribution disposed over the first insulation layer pattern and electrically connected with the first bonding pad; a second redistribution disposed over the first insulation layer pattern and electrically connected with the second bonding pad; a third redistribution disposed over the first insulation layer pattern and electrically connected with the third bonding pad; and a second insulation layer pattern disposed over the first insulation layer pattern and having second openings for exposing some portions of the first through third bonding pads.

The redistribution structure may further include solder balls electrically connected with the first through third bonding pads.

At least two of the first through third bonding pads are electrically connected with each other.

In another embodiment, a stacked wafer level package comprises an insulation member having a chip region having a receiving part and a peripheral region disposed at the periphery of the chip region; a first semiconductor chip coupled to the receiving part and having a first bonding pad; a second semiconductor chip disposed over the first semiconductor chip and having a second bonding pad electrically connected to a first connection electrode which passes through a portion of the insulation member corresponding to the peripheral region; a third semiconductor chip disposed over the third semiconductor chip and having a third bonding pad electrically connected to a second connection electrode which passes through a portion of the insulation member corresponding to the peripheral region; and a redistribution structure electrically connected with the first bonding pad, the first connection electrode and the second connection electrode.

A thickness of the insulation member is substantially the same as a thickness of the first semiconductor chip.

The second and third bonding pads are disposed at the centers of the second and third semiconductor chips respectively.

Alternatively, the second and third bonding pads may be disposed at the edges of the second and third semiconductor chips respectively.

The redistribution structure includes a first insulation layer pattern covering the first semiconductor chip and the insulation member, and having first openings for exposing the first bonding pad and the first and second connection electrodes; a first redistribution disposed over the first insulation layer pattern and electrically connected with the first bonding pad; a second redistribution disposed over the first insulation layer pattern and electrically connected with the first connection electrode; a third redistribution disposed over the first insulation layer pattern and electrically connected with the second connection electrode; and a second insulation layer pattern disposed over the first insulation layer pattern and having second openings for exposing some portions of the first through third bonding pads.

At least one of the first through third semiconductor chips is a different kind from the others.

In another embodiment, a stacked wafer level package comprises an insulation member having a chip region having a through part and a peripheral region disposed at the periphery of the chip region; a first semiconductor chip coupled to the through part and having a first bonding pad; a second semiconductor chip disposed over the first semiconductor chip and having a second bonding pad electrically connected to a connection electrode which passes through a portion of the insulation member corresponding to the peripheral region; and a redistribution structure electrically connected with the first bonding pad and connection electrode.

The insulation member includes a first insulation member and a second insulation member, and the first and second insulation members are flexible.

The redistribution structure includes a first insulation layer pattern covering the first semiconductor chip and the insulation member, and having first openings for exposing the first bonding pad and the connection electrodes; a first redistribution disposed over the first insulation layer pattern and electrically connected with the first bonding pad; a second redistribution disposed over the first insulation layer pattern and electrically connected with the connection electrode; and a second insulation layer pattern disposed over the first insulation layer pattern and having second openings for exposing some portions of the first and second bonding pads.

The first and the second semiconductor chips are different kinds of semiconductor chips.

A size of the second semiconductor chip is larger than a size of the first semiconductor chip, and the second semiconductor chip covers the first semiconductor chip.

The first and second redistributions are electrically connected with each other.

DESCRIPTION OF SPECIFIC EMBODIMENTS

Figure 1:
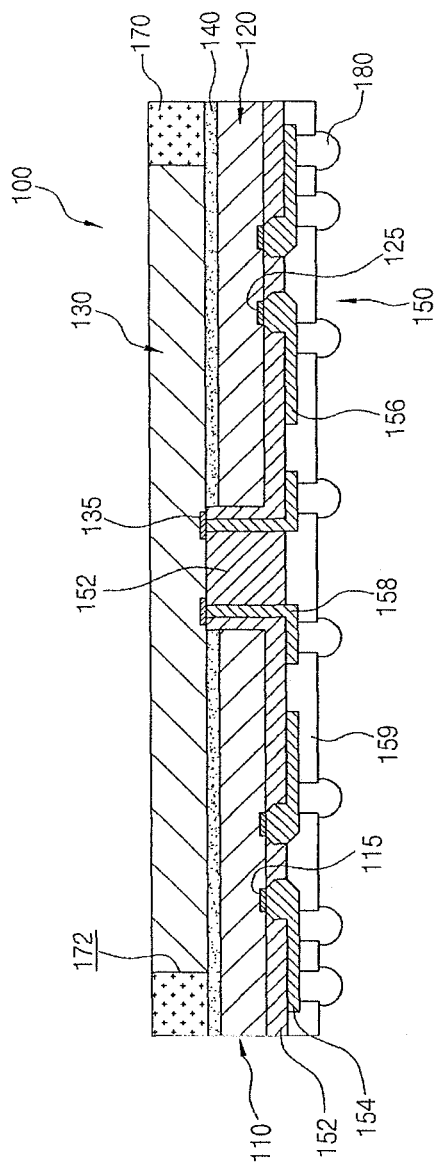
FIG. 1 is a cross-sectional view illustrating a stacked wafer level package in accordance with an embodiment of the present invention.

FIG. 1 is a cross-sectional view illustrating a stacked wafer level package in accordance with an embodiment of the present invention.

Referring to FIG. 1, a stacked wafer level package 100 includes a first semiconductor chip 110, a second semiconductor chip 120, a third semiconductor chip 130, and a redistribution structure (not shown). In addition, the stacked wafer level package 100 may further include an adhesive member 140 and a molding member 170.

The first and second semiconductor chips 110 and 120, in accordance with an embodiment of the present invention, act as a substrate for supporting the third semiconductor chip 130. In the present embodiment, since first and second semiconductor chips 110 and 120 act as a substrate for supporting the third semiconductor chip 130, the stacked wafer level package 100 in accordance with an embodiment of the present invention does not require a separate substrate for supporting the first through third semiconductor chips 110, 120 and 130. Accordingly, the thickness and/or volume of the stacked wafer level package 100 in accordance with an embodiment of the present invention can be significantly reduced.

Specifically, the first semiconductor chip 110, which acts as a substrate for supporting the third semiconductor chip 130, may have a rectangular parallelepiped plate shape.

The first semiconductor chip 110 includes a circuit part (not shown) and a first bonding pad 115.

The circuit part (not shown) includes, e.g., a data storage part (not shown) for storing data and a data processing part (not shown) for processing the data.

The first bonding pad 115 is disposed on a surface of the first semiconductor chip 110 and is electrically connected to the circuit part (not shown). In the present embodiment, the first bonding pad 115 may be disposed at a center portion of a surface of the first semiconductor chip 110 or at an edge of the surface of the first semiconductor chip 110.

The second semiconductor chip 120, which acts as a substrate for supporting the third semiconductor chip 130, is disposed coplanar to the first semiconductor chip 110. The second semiconductor chip 120, which acts as a substrate for supporting the third semiconductor chip 130, may have a rectangular parallelepiped plate shape.

The second semiconductor chip 120 includes a circuit part (not shown) and a second bonding pad 125.

The circuit part (not shown) includes, e.g., a data storage part (not shown) for storing data and a data processing part (not shown) for processing the data.

The second bonding pad 125 is disposed on a surface of the second semiconductor chip 120 and is electrically connected to the circuit part. In the present embodiment, the second bonding pad 125 may be disposed at a center portion of a surface of the second semiconductor chip 120 or at an edge of the upper surface of the second semiconductor chip 120.

In the present embodiment, the first and second semiconductor chips 110 and 120, which act as a substrate for supporting the third semiconductor chip 130, may be the same kind. However, the first and second semiconductor chips 110 and 120 may be different kinds.

In the present embodiment, the first bonding pad 115 of the first semiconductor chip 110 and the second bonding pad 125 of the second semiconductor chip 120 are formed to face the same direction on each semiconductor chip respectively. Additionally, the first bonding pad 115 of the first semiconductor chip 110 and the second bonding pad 125 of the second semiconductor chip 120 are disposed on substantially the same plane.

The third semiconductor chip 130 is disposed over the surfaces of the first and second semiconductor chips 110 and 120 opposite the first bonding pad 115 and second bonding pad 125, respectively. The third semiconductor chip 130 includes a circuit part (not shown) and third bonding pads 135.

The circuit part (not shown) of the third semiconductor chip 130 includes a data storage part (not shown) for storing data and a data processing part (not shown) for processing the data.

In the present invention, the third bonding pad 135 is electrically connected to the circuit part. The third bonding pad 135 is formed to face the same direction as that of the first and second bonding pads 115 and 125 of the semiconductor chips 110 and 120. The third bonding pad 135 is disposed so as to be between the first and second semiconductor chips 110 and 120.

The molding member 170 covers side surfaces of the third semiconductor chip 130. Specifically, the molding member 170 is formed to surround the perimeter of the third semiconductor chip 130. The molding member 170 is formed to have an opening 172 for receiving the third semiconductor chip 130. The molding member 170 having the opening 172 to receive the third semiconductor chip 130, is attached to the first and second semiconductor chips 110 and 120.

Specifically, the adhesive member 140 is interposed between the first semiconductor chip 110 and the third semiconductor chip 130 and between the second semiconductor chip 120 and the third semiconductor chip 130. Therefore, the first semiconductor chip 110 and the third semiconductor chip 130 are attached to each other and the second semiconductor chip 120 and the third semiconductor chip 130 are attached to each other.

In the present embodiment, the first through third semiconductor chips 110, 120 and 130 may all be the same kind of the semiconductor chip. However, at least one of the first through third semiconductor chips 110, 120 and 130 may be a different kind of the semiconductor from the others.

The redistribution structure 150 is electrically connected to the first bonding pad 115 of the first semiconductor chip 110, the second bonding pad 125 of the second semiconductor chip 120 and the third bonding pad 135 of the third semiconductor chip 130 respectively.

The redistribution structure 150 includes a first insulation layer pattern 152, a first redistribution 154, a second redistribution 156, a third redistribution 158, and a second insulation layer pattern 159.

The first insulation layer pattern 152 covers the first semiconductor chip 110, the second semiconductor chip 120 and a portion of the third semiconductor chip 130 that is exposed between the first semiconductor chip 110 and the second semiconductor chip 120. In the present embodiment, the first insulation layer pattern 152 may be an organic layer that includes organic matters.

The first insulation layer pattern 152 has openings for exposing the first bonding pad 115 of the first semiconductor chip 110, the second bonding pad 125 of the second semiconductor chip 120 and the third bonding pad 135 of the third semiconductor chip 130.

The first redistribution 154 is disposed over the first insulation layer pattern 152 and may be electrically connected with the first bonding pad 115 of the first semiconductor chip 110.

The second redistribution 156 is disposed over the first insulation layer pattern 152 and may be electrically connected with the second bonding pad 125 of the second semiconductor chip 120.

The third redistribution 158 is disposed over the first insulation layer pattern 152 and may be electrically connected with the third bonding pad 135 of the third semiconductor chip 130.

The second insulation layer pattern 159 is disposed over the first insulation layer pattern 152 and the first through third redistributions 154, 156, and 158. The second insulation layer 159 may be an organic layer that includes organic matters. The second insulation layer pattern 159 includes openings to expose portions of the first through third redistribution 154, 156, and 158.

The redistribution structure 150 may further include solder balls 180. The solder balls 180 are connected to the portions of the first through third redistribution 154, 156 and 158 that are exposed by the openings formed in the second insulation layer pattern 159.

In the present embodiment, the first through third redistributions 154, 156, and 158 of the redistribution structure 150 may be electrically connected to one another.

In the stacked wafer level package 100 in accordance with an embodiment of the present invention, the first and second semiconductor chips 110 and 120 are attached to the third semiconductor chip 130 to act as a substrate for supporting the third semiconductor chip 130, and therefore, a volume, a thickness and a weight, of the stacked wafer level package 100 is reduced while assembling processes and production costs are significantly reduced.

Also, in stacked wafer level package 100 in accordance with an embodiment of the present invention, the first through third bonding pads 115, 125 and 135 of the first through third semiconductor chips 110, 120 and 130 are electrically connected using the redistribution structure 150 without conductive wires or through-electrodes, and therefore, the volume and the thickness of the stacked wafer level package 100 can be further reduced.

Hereinafter, a method for fabricating the stacked wafer level package as shown in FIG. 1 will be described with reference to FIGS. 2 through 9.

Figure 2:
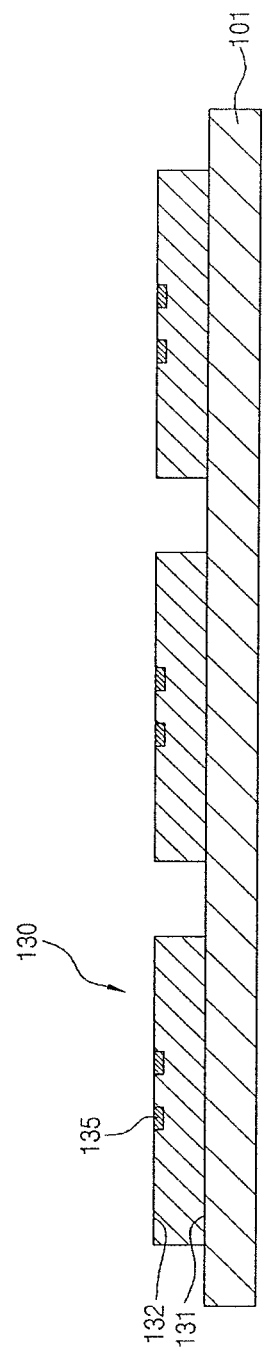
FIG. 2 is a cross-sectional view illustrating a third semiconductor chip disposed over a carrier substrate.

FIG. 2 is a cross-sectional view illustrating that a third semiconductor chip is disposed over a carrier substrate.

Referring to FIG. 2, the third semiconductor chip 130 is disposed over a carrier substrate 101. In the present embodiment of the present invention, the carrier substrate 101 may be a dummy wafer. Alternatively, the carrier substrate 101 may include various substrates such as a synthetic resin substrate, a metal substrate, a glass substrate and the like.

A plurality of third semiconductor chips 130 is disposed over the carrier substrate 101 according to predetermined spacing. Each of the third semiconductor chips 130 includes a circuit part (not shown). The third bonding pad 135 may be disposed at a center portion of an upper surface 132 of the third semiconductor chip 130, which is opposite a lower surface 131 in contact with the carrier substrate 101.

Figure 3:
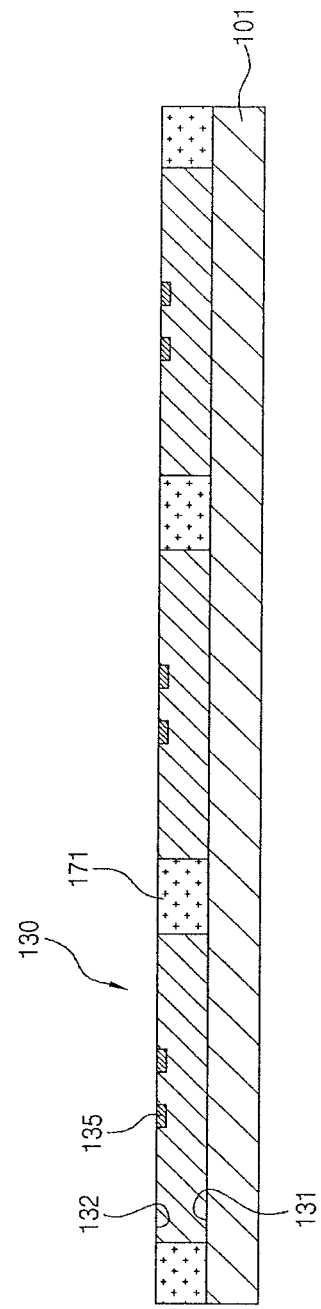
FIG. 3 is a cross-sectional view illustrating a preliminary molding member formed over the carrier substrate shown in FIG. 2.

FIG. 3 is a cross-sectional view illustrating a preliminary molding member formed over the carrier substrate as shown in FIG. 2.

Referring to FIG. 3, after the lower surface 131 of the third semiconductor chip 130 is disposed on the carrier substrate 101, a preliminary molding member 171 is disposed on both sides of the semiconductor chips 130 so as to fill in the spaces between the third semiconductor chips 130 that are spaced apart by predetermined spacing and encompass the perimeter of the semiconductor chips 130.

In the present embodiment, the preliminary molding member 171 includes organic matters and may be fabricated by disposing the organic matters as a fluid-like substance in the spaces between the third semiconductor chips 130 and subsequently curing the organic matters. Alternatively, the preliminary molding member 171 may include a molding material such as an epoxy resin.

In this embodiment of the present invention, although the preliminary molding member 171 is formed in the spaces between the third semiconductor chips 130 that are spaced apart by predetermined spacing, the preliminary molding member 171 may also not be formed between the third semiconductor chips 130.

Figure 4:
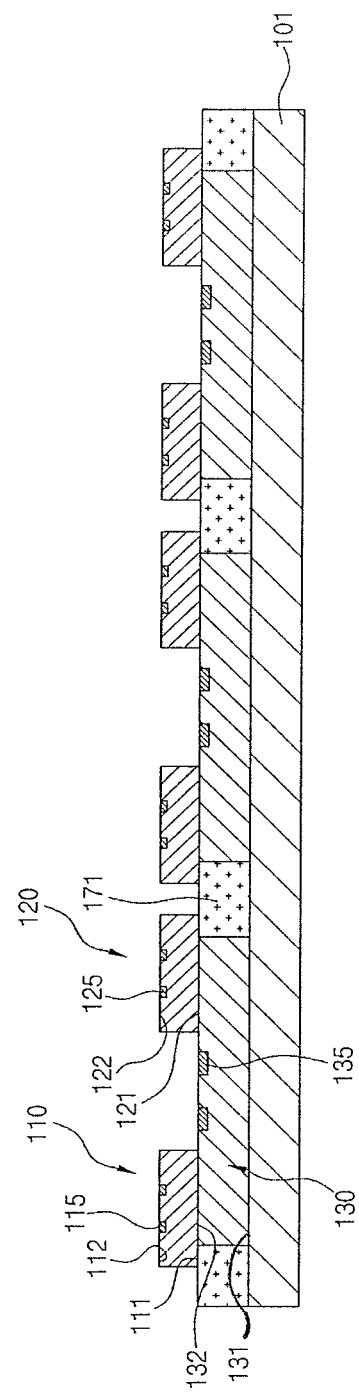
FIG. 4 is a cross-sectional view illustrating first and second semiconductor chips disposed over the third semiconductor chip shown in FIG. 3.

FIG. 4 is a cross-sectional view illustrating first and second semiconductor chips disposed over the third semiconductor chip as shown in FIG. 3.

The second semiconductor chip 120 is disposed on the upper surface 132 of the third semiconductor chip 130. One variant of this layout is that the second semiconductor chip 120 is directly disposed on a portion of the upper surface 132 of the third semiconductor chip 130. In this embodiment of the present invention, the second semiconductor chip 120 may be disposed to one side of the third bond pad 135. As shown in FIG. 4, second semiconductor chip 120 is disposed to the right of the third bonding pad 135 of the third semiconductor chip 130.

The second semiconductor chip 120 has a lower surface 121 and an upper surface 122. The lower surface 121 of the second semiconductor chip 120 is disposed on the upper surface 132 of the third semiconductor chip 130 and a portion of the preliminary molding member 171. One variant of this layout scheme is that the lower surface 121 of the second semiconductor chip 120 may be directly disposed on a portion of the upper surface 132 of the third semiconductor chip 130 and directly on a portion of the preliminary molding member 171.

The second semiconductor chip 120 includes the second bonding pad 125 and is disposed over the upper surface 122 of the second semiconductor chip 120.

Meanwhile, the first semiconductor chip 110 is disposed on the upper surface 132 of the third semiconductor chip 130. One variant of this layout scheme is that the first semiconductor chip 110 may be directly disposed on a portion of the upper surface 132 of the third semiconductor chip 130. In this embodiment of the present invention, the first semiconductor chip 110 may be disposed to one side of the third bonding pad 135 opposite to the second semiconductor chip 120. As show in FIG. 4, first semiconductor chip 110 is disposed to the left of the third bonding pad 135 of the third semiconductor chip 130.

The first semiconductor chip 110 has a lower surface 111 and an upper surface 112. The lower surface 111 of the first semiconductor chip 110 is disposed on the upper surface 132 of the third semiconductor chip 130 and a portion of the preliminary molding member 171. One variant of this layout scheme is that the lower surface 111 of the first semiconductor chip 110 may be disposed directly on a portion of the upper surface 132 of the third semiconductor chip 130 and directly on a portion of the preliminary molding member 171.

The first semiconductor chip 110 includes the first bonding pad 115 and is disposed over the upper surface 112 of the first semiconductor chip 120.

According to the present embodiment of the present invention, the first and second semiconductor chips 110 and 120 are attached to the third semiconductor chip 130 using the adhesive member. The third bonding pad 135 is exposed to the outside between the first and second semiconductor chips 110 and 120 that are disposed on both sides of the third bond pad 135 respectively.

Figure 5:
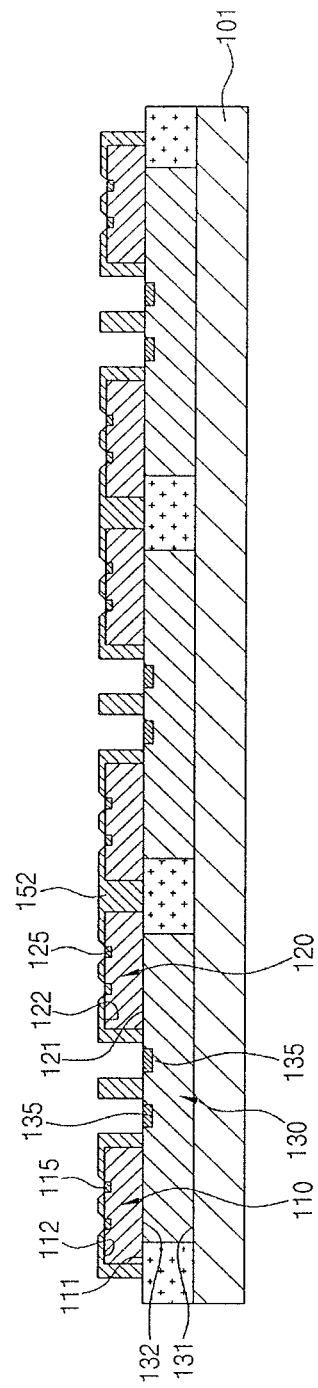
FIGS. 5 through 7 are cross-sectional views illustrating a redistribution structure formed in the first through third semiconductor chips shown in FIG. 4.
Figure 6:
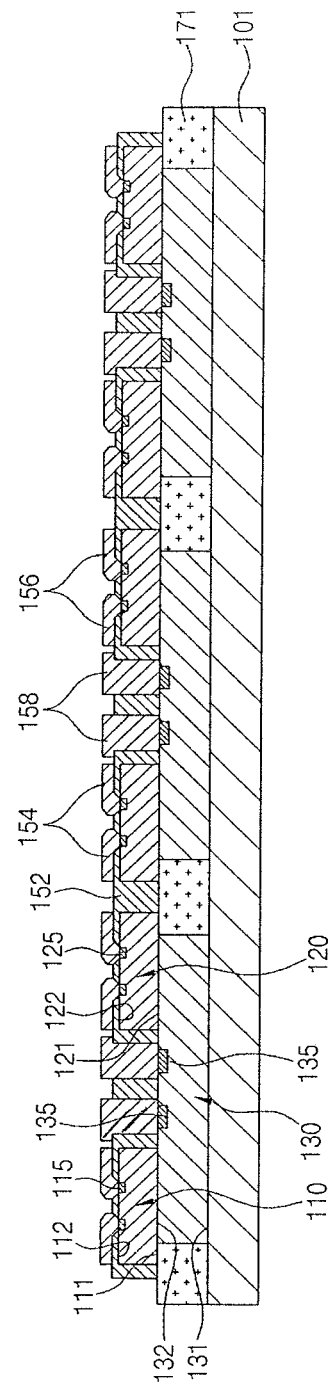
Figure 7:
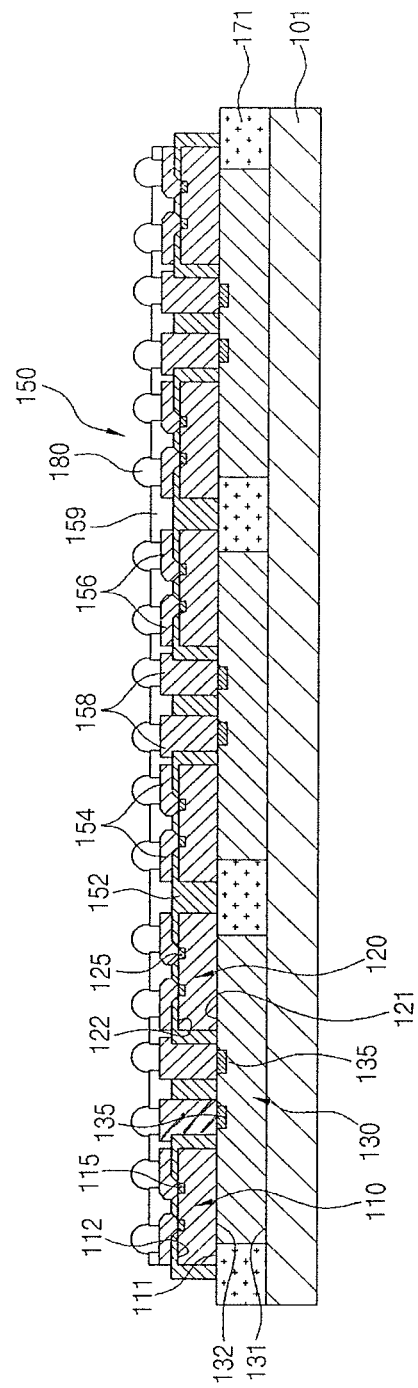

FIGS. 5 through 7 are cross-sectional views illustrating the formation of a redistribution structure in the first through third semiconductor chips as shown in FIG. 4.

Referring to FIG. 5, a first insulation layer (not shown) is formed over the first through third semiconductor chips 110, 120 and 130 shown in FIG. 4. In the present embodiment of the present invention, the first insulation layer may be an organic layer.

The first insulation layer is patterned using a photoresist pattern (not shown) as an etching mask. Using the photoresist pattern as an etching mask, the first insulation layer pattern 152 is formed over the first through third semiconductor chips 110, 120 and 130 having openings for exposing the first bonding pad 115 of the first semiconductor chip 110, the second bonding pad 125 of the second semiconductor chip 120 and the third bonding pad 135 of the third semiconductor chip 130.

Referring to FIG. 6, after the first insulation layer pattern 152 is formed over the first through third semiconductor chips 110, 120 and 130, a seed metal layer (not shown) is formed over the entire area of the first insulation layer pattern 152.

The seed metal layer may be formed of a material such as titanium, nickel, vanadium, or copper. The seed metal layer may be formed over the first insulation layer pattern 152 by a sputtering process or a chemical vapor deposition process.

After the seed metal layer is formed over the first insulation layer pattern 152, a plating mask (not shown) having openings for forming the first through third redistributions, which will be described in later, is formed. The plating mask may be a photoresist pattern.

The first through third redistributions 154, 156, and 158 are formed over the seed metal layer using the plating mask. The first through third redistributions 154, 156 and 158 may be formed of copper.

The first redistribution 154 is disposed over the first insulation layer pattern 152 and is electrically connected to the first bonding pad 115 of the first semiconductor chip 110 through the opening in the insulation pattern 152 for exposing the first bonding pad 115.

The second redistribution 156 is disposed over the first insulation layer pattern 152 and is electrically connected to the second bonding pad 125 of the second semiconductor chip 120 through the opening in the insulation pattern 152 for exposing the second bonding pad 125.

The third redistribution 158 is disposed over the first insulation layer pattern 152 and is electrically connected to the third bonding pad 135 of the third semiconductor chip 130 through the opening in the insulation pattern 152 for exposing the third bonding pad 135.

According to the present embodiment of the present invention, at least two of the first through third redistributions 154, 156, and 158 may be electrically connected to each other.

Referring to FIG. 7, after the first through third redistributions 154, 156, and 158 are formed over the first insulation layer pattern 152, the second insulation layer pattern 159 is formed over the first insulation layer pattern 152 and the first through third redistributions 154, 156, and 158. The second insulation layer pattern 159 may include organic matters.

The second insulation layer pattern 159 is patterned using a photoresist pattern disposed over the second insulation layer pattern 159. Accordingly, the second insulation layer pattern 159 is formed over the first insulation layer pattern 152 having openings for exposing portions of the first through third redistributions 154, 156 and 158.

After the second insulation layer pattern 159 is formed over the first insulation layer pattern 152, solder balls 180 are electrically connected to the first through third redistributions 154, 156, and 158 exposed by the openings of the second insulation layer pattern 159. As a result, the redistribution structure 150 is fully fabricated.

Figure 8:
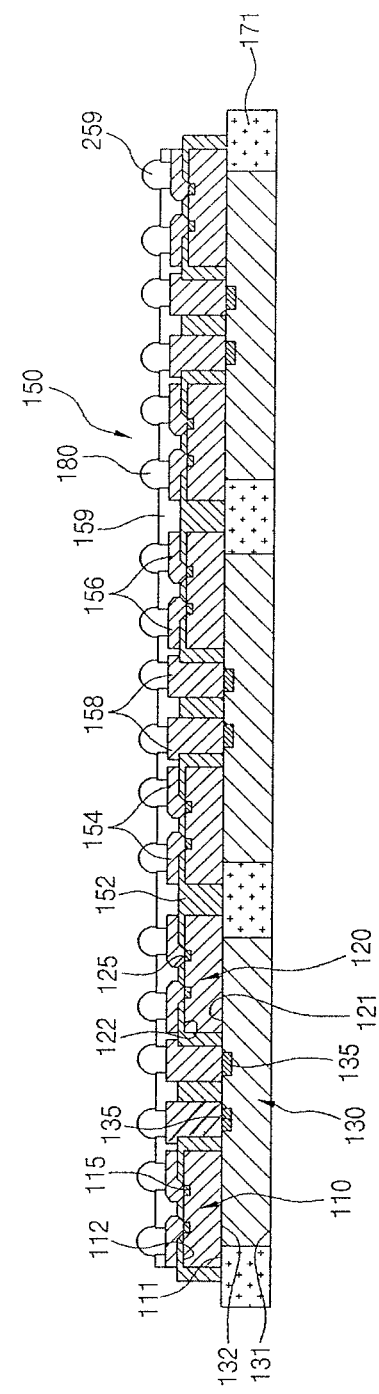
FIG. 8 is a cross-sectional view illustrating the carrier substrate of FIG. 7 removed.

FIG. 8 is a cross-sectional view illustrating the carrier substrate of FIG. 7 removed.

Referring to FIG. 8, after the redistribution structure 150 is fabricated, the carrier substrate 101, which is attached to the third semiconductor chip 130, is removed from the third semiconductor chip 130.

Figure 9:
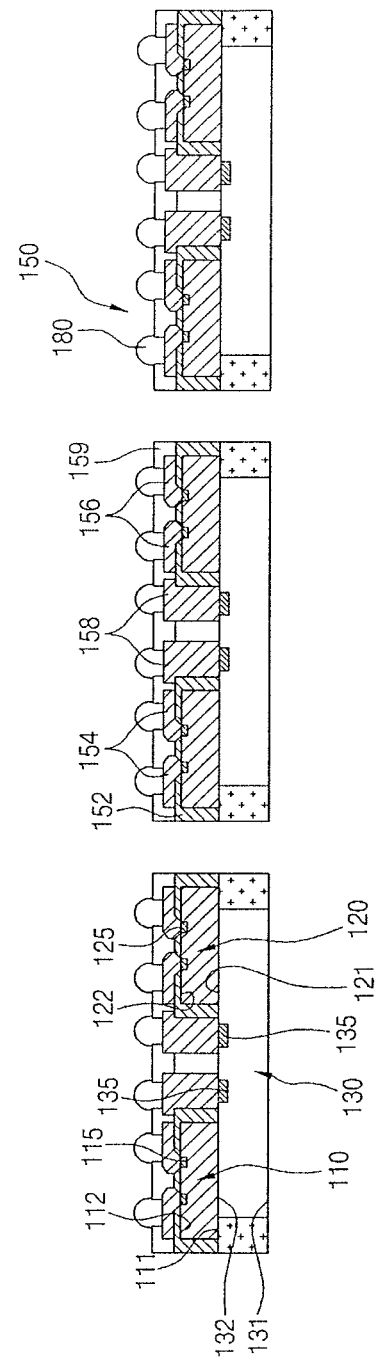
FIG. 9 is a cross-sectional view illustrating stacked wafer level packages separated from the structure of FIG. 8.

FIG. 9 is a cross-sectional view illustrating how individual stacked wafer level packages are separated from the structure of FIG. 8.

Referring to FIG. 9, each group of first through third semiconductor chips 110, 120 and 130 is cut away from one another, thereby finishing fabrication of the stacked wafer level package 100 according to an embodiment of the present invention.

Figure 10:
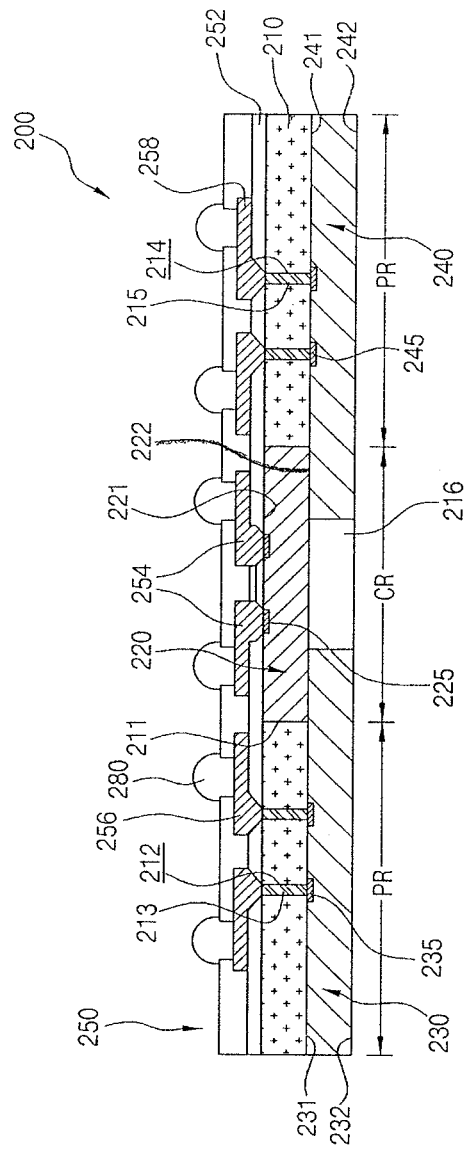
FIG. 10 is a cross-sectional view illustrating a stacked wafer level package in accordance with another embodiment of the present invention.

FIG. 10 is a cross-sectional view illustrating a stacked wafer level package in accordance with another embodiment of the present invention.

Referring to FIG. 10, a stacked wafer level package 200 includes an insulation member 210, a first semiconductor chip 220, a second semiconductor chip 230, a third semiconductor chip 240, and a redistribution structure 250.

The insulation member 210 has a chip region CR and a peripheral region PR disposed at a peripheral region of the chip region CR. The opening of the chip region CR of the insulation member 210 is opened by a through part 211 which passes through the insulation member 210.

In this embodiment of the present invention, the insulation member 210 may include organic matters or an epoxy resin.

The first semiconductor chip 220 is coupled to the receiving groove 211 of the insulation member 210. The first semiconductor chip 220 has a first bonding pad 225. The first bonding pad 225 is electrically connected to a circuit part (not shown) of the first semiconductor chip 220 and may be disposed at a center portion of an upper surface 221 of the first semiconductor chip 220. In this embodiment of the present invention, the thickness of the first semiconductor chip 220 may be substantially the same as a thickness of the insulation member 210.

The second semiconductor chip 230 contacts a lower surface 222 of the first semiconductor chip 220 that is opposite the upper surface 221. One variant of this layout scheme is that the second semiconductor chip 230 may directly contact a portion of the lower surface 222 of the first semiconductor chip 220 in which the lower surface 22 is opposite that of the upper surface 221. The second semiconductor chip 230 includes a second bonding pad 235 and is exposed in relation to the first semiconductor chip 220. In the present embodiment, the second bonding pad 235 of the second semiconductor chip 230 may be disposed at a center portion of a surface of the second semiconductor chip 230 or at an edge of the surface of the second semiconductor chip 230.

The second semiconductor chip 230 has an upper surface 231 facing the lower surface 222 of the first semiconductor chip 220 and a lower surface 232 that is opposite to the upper surface 231.

Meanwhile, the upper surface 231 of the second semiconductor chip 230 is opposite the insulation member 210. One variant of this layout scheme is that a portion of the upper surface 231 of the second semiconductor chip 230 is opposite and directly contacting the insulation member 210. A first through part 212 is formed in a portion of the insulation member corresponding to the second bonding pad 235 of the second semiconductor chip 230 for exposing the second bonding pad 235.

A first connection electrode 213 is disposed in the first through part 212 and is electrically connected to the second bonding pad 235. The first connection electrode 213 may be formed of a material including copper.

The third semiconductor chip 240 contacts the lower surface 222 of the first semiconductor chip 220. One variant of this layout scheme is that a portion of the upper surface 241 of the third semiconductor chip 240 directly contacts a portion of the lower surface 222 of the first semiconductor chip 220. The third semiconductor chip 240 includes a third bonding pad 245 and is exposed in relation to the first semiconductor chip 220. In the present embodiment, the third bonding pad 245 of the third semiconductor chip 240 may be disposed at a center portion of a surface of the third semiconductor chip 240 or at an edge of the surface of the third semiconductor chip 240.

The third semiconductor chip 240 has an upper surface 241 facing the lower surface 222 of the first semiconductor chip 220 and a lower surface 242 that is opposite to the upper surface 241. One variant of this layout scheme is that the upper surfaces (231 and 241) of the second and third semiconductor chips (230 and 240) are in direct contact with the lower surface 222 of the first semiconductor chip 220 in which the lower surface 222 of the first semiconductor chip 220 is substantially opposite the upper surface 221 of the first semiconductor chip 220.

In the present depicted embodiment of the present invention, the first through third semiconductor chips 220, 230 and 240 may be all the same kind of semiconductor chip. However, it is envisioned that at least one of the first through third semiconductor chips 220, 230 and 240 may be a different kind of semiconductor chip from the others.

Meanwhile, the upper surface 241 of the third semiconductor chip 240 is opposite the insulation member 210. One variant of this layout scheme is that a portion of the upper surface 241 of the third semiconductor chip 240 is opposite and directly contacting the insulation member 210. A second through part 214 is formed in a portion of the insulation member corresponding to the third bonding pad 245 of the third semiconductor chip 240 for exposing the third bonding pad 245.

A second connection electrode 215 is disposed in the second through part 214 and is electrically connected to the third bonding pad 245. The second connection electrode 215 may be formed of a material including copper.

Meanwhile, an insulation member 216 may be disposed in a space formed between the second and third semiconductor chips 230 and 240.

The redistribution structure 250 includes a first insulation layer pattern 252, a first redistribution 254, a second redistribution 256, a third redistribution 258, and a second insulation layer pattern 259.

The first insulation layer pattern 252 covers the upper surface 221 of the first semiconductor chip 220 and the insulation member 210. The first insulation layer pattern 252 may be an organic pattern and has openings for exposing the first bonding pad 225 of the first semiconductor chip 220 and the first and second connection electrodes 213 and 215 disposed in the insulation member 210.

The first insulation layer pattern 252 includes the first redistribution 254, the second redistribution 256, and the third redistribution 258 formed thereon. The first through third redistributions 254, 256 and 258 may be formed to include copper.

The first redistribution 254 is electrically connected to the first bonding pad 225 of the first semiconductor chip 220. The second redistribution 256 is electrically connected to the second bonding pad 235 of the second semiconductor chip 230 via the first connection electrode 213. The third redistribution 258 is electrically connected to the third bonding pad 245 of the third semiconductor chip 240 via the second connection electrode 215.

The second insulation layer pattern 259 is disposed over the first insulation layer pattern 252 and covers a portion of the first through third redistributions 254, 256, and 258. The second insulation layer pattern 259 includes an organic layer and includes openings for portions of the first through third redistributions 254, 256 and 258 to be exposed.

In the present embodiment, the first redistribution 254, the second redistribution 256, and the third redistribution 258 may be electrically connected to one another.

Solder balls 280 are formed and are electrically connected to the first through third redistributions 254, 256 and 258 exposed by the second insulation layer pattern 259.

Figure 11:
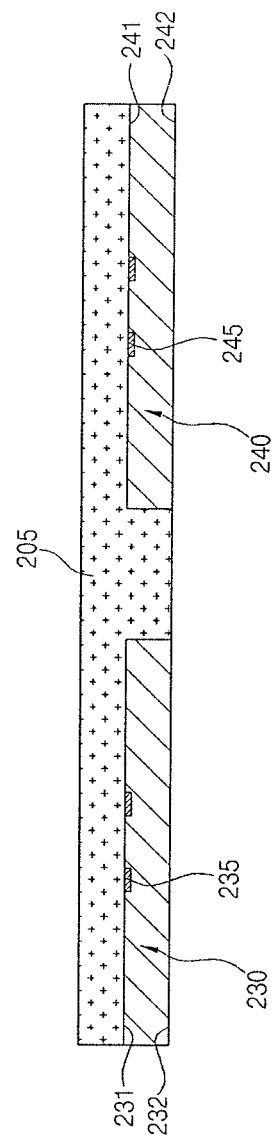
FIGS. 11 through 13 are cross-sectional views illustrating the steps of a method for fabricating the stacked wafer level package as shown in FIG. 10.
Figure 12:
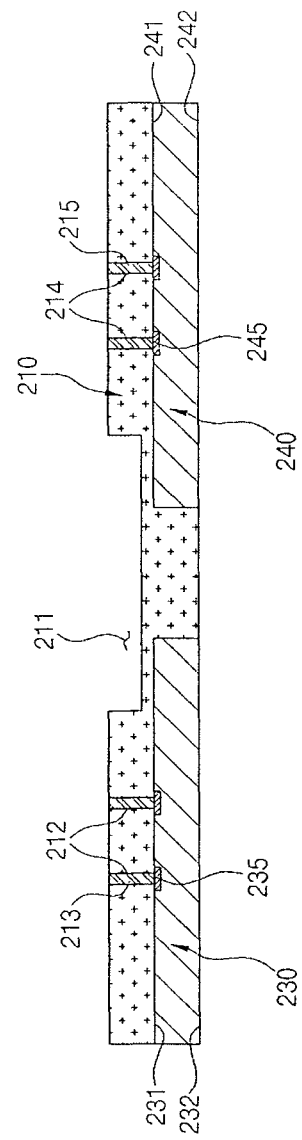
Figure 13:
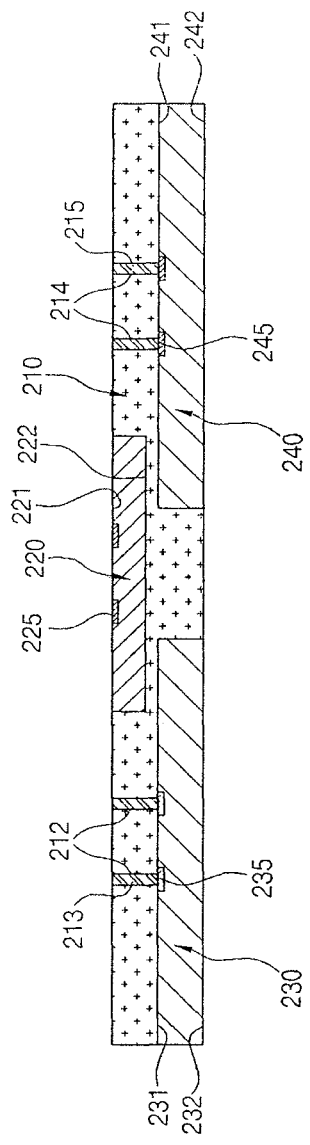

FIGS. 11 through 13 are cross-sectional views illustrating the steps of a method for fabricating the stacked wafer level package as shown in FIG. 10.

Referring to FIG. 11, the second semiconductor chip 230 and the third semiconductor chip 240 are disposed over a carrier substrate (not shown). In the present embodiment, the carrier substrate (not shown) may be a dummy wafer.

The second semiconductor chip 230 and the third semiconductor chip 240 are disposed apart from each other by a predetermined spacing over the carrier substrate. In the present embodiment, the second bonding pad 235 is formed on the upper surface 231 of the second semiconductor chip 230 and the third bonding pad 245 is formed on the upper surface 241 of the third semiconductor chip 240 facing the same direction as the second bonding pad 235.

After the second and third semiconductor chips 230 and 240 are disposed over the carrier substrate, a preliminary insulation member 205 is formed over the second and third semiconductor chips 230 and 240. The preliminary insulation member 205 may be fabricated by disposing organic matters as fluid-like substances over the second and third semiconductor chips 230 and 240 and subsequently curing the fluidic organic matters.

Referring to FIG. 12, after the preliminary insulation member 205 is fabricated for covering the second and third semiconductor chips 230 and 240, a receiving groove 211 that is suitable for receiving the first semiconductor chip 220 is formed in a portion of the preliminary insulation member 205. The receiving groove 211 if formed such that it is located between the second bonding pad 235 of the second semiconductor chip 230 and the third bonding pad 245 of the third semiconductor chip 240.

Meanwhile, preliminary insulation member 205 is formed to include the first through part 212 to expose the second bonding pad 235 of the second semiconductor chip 230 and the second through part 214 to expose the third bonding pad 245 of the third semiconductor chip 240. Thereafter, the insulation member covering the second and third semiconductor chips 230 and 240 having a receiving groove 211 formed therein is fabricated.

After the first through part 212 is formed, the first through electrode 213 is formed in the first through part 212. After the second through part 214 is formed, the second through electrode 215 is formed in the second through part 212.

Referring to FIG. 13, the first semiconductor chip 220 is disposed in the receiving groove (hereinafter referred to as the receiving part) 211 of the insulation member 210 such that the first bonding pad 225 of the first semiconductor chip 220 is exposed to the outside. That is, the first semiconductor chip 220 is disposed in the receiving part 211 with the lower surface 222 facing downwards into the receiving part 211.

Referring again to FIG. 10, after the first semiconductor chip 220 is coupled into the receiving part 211 of the insulation member 210, a first insulation layer (not shown) is formed over the insulation member 210 and the second semiconductor chip 220.

After the first insulation layer is formed, the first insulation layer is patterned to form the first insulation layer pattern 252 having openings to expose the first bonding pad 225 of the first semiconductor chip 220 and the first and second connection electrodes 213 and 215 of the insulation member 210.

Over the first insulation layer pattern 252, the first redistribution 254 is electrically connected to the first bonding pad 225, the second redistribution 256 is electrically connected to the first connection electrode 213, and the third redistribution 258 is electrically connected to the second connection electrode 215. The first through third redistributions 254, 256, and 258 may be formed by a plating process.

In the present embodiment according to the present invention, the first redistribution 254, the second redistribution 256 and the third redistribution 258 may be electrically connected to one another.

Subsequently, a second insulation layer (not shown) is formed over the first insulation layer pattern 252 and the first through third redistributions 254, 256, and 258. The second insulation layer is then patterned after formation. Therefore, the second insulation layer pattern 259 is formed over the first insulation layer pattern 252 having openings to expose portions of the first through third redistribution 254, 256, and 258 is formed.

After the second insulation layer pattern 259 is formed, solder balls 280 are electrically attached to the first through third redistributions 254, 256 and 258 through the portions exposed by the openings of the second insulation layer pattern 259.

Figure 14:
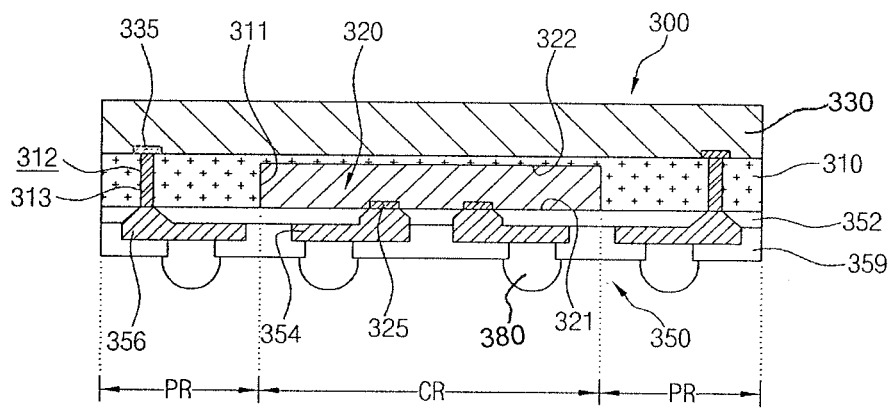
FIG. 14 is a cross-sectional view illustrating a stacked wafer level package in accordance with another embodiment of the present invention.

FIG. 14 is a cross-sectional view illustrating a stacked wafer level package in accordance with another embodiment of the present invention.

Referring to FIG. 14, a stacked wafer level package 300 includes an insulation member 310, a first semiconductor chip 320, a second semiconductor chip 330, and a redistribution structure 350.

The insulation member 310 has a chip region CR and a peripheral region PR disposed adjacent to both sides of the chip region CR. The chip region CR of the insulation member 310 is formed with a through part 311 which passes through the insulation member 310.

In the present embodiment, the insulation member 310 may include organic matters.

The first semiconductor chip 320 is coupled to the through part 311 of the insulation member 310 and has a first bonding pad 325. The first bonding pad 325 is electrically connected to a circuit part (not shown) of the first semiconductor chip 320. The first bonding pad 325 may be disposed at a center portion of an upper surface 321 of the first semiconductor chip 320. In the present embodiment, the thickness of the first semiconductor chip 320 may be substantially the same as a thickness of the insulation member 310.

The second semiconductor chip 330 contacts a lower surface 322 of the first semiconductor chip 320 that is opposite the upper surface 321 of the first semiconductor chip 320. One variant of this layout scheme is that a portion of the insulation member 310 is between the second semiconductor chip 330 and the first semiconductor chip 320. The second semiconductor chip 330 includes a second bonding pad 335 and is exposed in relation to the first semiconductor chip 320. According to the present embodiment of the present invention, the second bonding pad 335 of the second semiconductor chip 330 is disposed at an edge of the second semiconductor chip 330. That is, the second bonding pad 335 is formed on a surface of the second semiconductor chip 330 on either side of the first semiconductor 320 that is attached to the second semiconductor chip 330.

In the present embodiment, the first semiconductor chip 320 has a first size and the second semiconductor chip 330 has a second size that is larger than the first size. For example, the second semiconductor chip 330 being longer than the first semiconductor chip 320, extends beyond both ends of the first semiconductor chip 320 whereby the second bonding pad 335 of the second semiconductor chip 330 is exposed in relation to the first semiconductor chip 320.

A portion of the insulation member 310 that corresponds to the second bonding pad 335 of the second semiconductor chip 330 is formed with a through part 312. A connection electrode 313 is disposed in the through part 312.

The connection electrode 313 is connected to the second bonding pad 335. The connection electrode 313 may be formed to include copper.

In the present embodiment, the first and second semiconductor chips 320 and 330 may be the same kind of semiconductor chip. However, the first and second semiconductor chips 320 and 330 may be different kinds of semiconductor chips.

The redistribution structure 350 includes a first insulation layer pattern 352, a first redistribution 354, a second redistribution 356, and a second insulation layer pattern 359.

The first insulation layer pattern 352 covers the upper surface 321 of the first semiconductor chip 320 and the insulation member 310. The first insulation layer pattern 352 may be an organic pattern. The first insulation layer pattern 352 has openings to expose the first bonding pad 325 of the first semiconductor chip 320 and the connection electrode 313 disposed in the insulation member 310.

The first insulation layer pattern 352 includes the first redistribution 354 and the second redistribution 356 formed thereon. The first and second redistributions 354 and may be formed to include copper.

The first redistribution 354 is electrically connected to the first bonding pad 325 of the first semiconductor chip 320 and the second redistribution 356 is electrically connected with the second bonding pad 335 via the connection electrode 313.

The second insulation layer pattern 359 is disposed over the first insulation layer pattern 352 and the first and second redistributions 354 and 356. The second insulation layer pattern 359 includes openings for portions of the first and second redistributions 354 and 356 to be exposed.

In the present embodiment, the first and second redistributions 354 and 356 may be electrically connected to each other.

Solder balls 380 are electrically connected to the portions of the first and second redistributions 354 and 356 exposed by the second insulation layer pattern 359.

Figure 15:
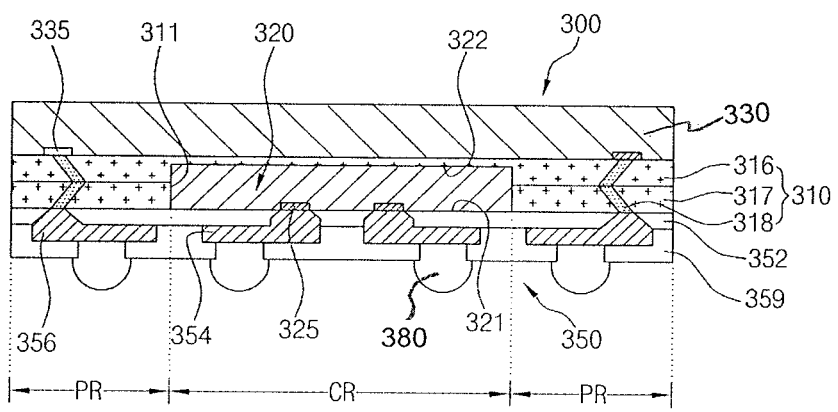
FIG. 15 is a cross-sectional view illustrating a stacked wafer level package in accordance with yet another embodiment of the present invention.

In the present embodiment of the present invention, although the insulation member 310 may include organic matters, the insulation member 310 may also include a first insulation member 316 and a second insulation member 317 that are stacked in a multi-layer configuration as shown in FIG. 15. In the present embodiment, the first and the second insulation members 316 and 317 may be flexible substrates.

The first and the second insulation members 316 and 317 may further include a connection member 318 that electrically connects the second redistribution 356 and the second bonding pad 335 of the second semiconductor chip 330.

As is apparent from the above description, in the present invention, a lower semiconductor chip is used as a substrate for supporting an upper semiconductor chip of a plurality of stacked semiconductor chips. In the present invention, the stacked semiconductor chips are electrically connected without the use of conductive wires or through electrodes. Accordingly, the present invention is advantageous in that a volume, a thickness, and a weight of the stacked wafer level package can be significantly reduced.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A stacked wafer level package, comprising:
an insulation member including a chip region having a receiving groove formed in a surface of the insulation member, a first peripheral region disposed at a first side adjacent to the chip region and a second peripheral region disposed at a second side adjacent to the chip region opposite the first side;
a first semiconductor chip having a first bonding pad formed on an upper surface thereof and coupled to the receiving groove of the chip region of the insulation member;
a second semiconductor chip disposed on a lower surface of the insulation member in the first peripheral region and a portion of a lower surface of the first semiconductor chip that is opposite to the upper surface adjacent to therein and having a second bonding pad formed on an upper surface thereof electrically connected to a first connection electrode that passes through a portion of the insulation member;
a third semiconductor chip disposed on a lower surface of the insulation member in the second peripheral region and another portion of the lower surface of the first semiconductor chip adjacent to therein and having a third bonding pad formed on an upper surface thereof electrically connected to a second connection electrode that passes through a portion of the insulation member; and
a redistribution structure including a first redistribution, a second redistribution, and a third redistribution each directy connected to the first bonding pad, the first connection electrode, and the second connection electrode, wherein the upper surfaces of the second and the third semiconductor chips are in direct contact with the lower surface of the first semiconductor chip, wherein the first redistribution, the second redistribution, and the third redistribution are placed on the same plane.

2. The stacked wafer level package according to claim 1, wherein a thickness of the insulation member is substantially the same as a thickness of the first semiconductor chip.

3. The stacked wafer level package according to claim 1, wherein the second and the third bonding pads are disposed at a center region of the upper surface of the second and the third semiconductor chips respectively.

4. The stacked wafer level package according to claim 1, wherein the second and third bonding pads are disposed at an edge region of the upper surface of the second and the third semiconductor chips respectively.

5. The stacked wafer level package according to claim 1, wherein the redistribution structure includes:
- a first insulation layer pattern covering the first semiconductor chip and the insulation member, and having first openings for exposing the first bonding pad and the first and the second connection electrodes;
- the first redistribution disposed over the first insulation layer pattern and electrically connected with the first bonding pad through the respective first opening of the first insulation layer;
- the second redistribution disposed over the first insulation layer pattern and electrically connected with the first connection electrode through the respective first opening of the first insulation layer;
- the third redistribution disposed over the first insulation layer pattern and electrically connected with the second connection electrode through the respective first opening of the first insulation layer; and
- a second insulation layer pattern disposed over the first insulation layer pattern and the first through third redistributions and having second openings for exposing portions of the first through third redistributions.

6. The stacked wafer level package according to claim 1, wherein at least one of the first through third semiconductor chips is of a different type of semiconductor chip from the others.

7. A stacked wafer level package, comprising:
- an insulation member including a chip region having a receiving groove formed in a surface of the insulation member, a first peripheral region disposed at a first side adjacent to the chip region and a second peripheral region disposed at a second side adjacent to the chip region opposite the first side, wherein a thickness of the insulation member is substantially the same as a thickness of the first semiconductor chip;
- a first semiconductor chip having a first bonding pad formed on an upper surface thereof and coupled to the receiving groove of the chip region of the insulation member;
- a second semiconductor chip disposed on a lower surface of the insulation member in the first peripheral region and a portion of a lower surface of the first semiconductor chip that is opposite to the upper surface adjacent to therein and having a second bonding pad formed on an upper surface thereof electrically connected to a first connection electrode that passes through a portion of the insulation member;
- a third semiconductor chip disposed on a lower surface of the insulation member in the second peripheral region and another portion of the lower surface of the first semiconductor chip adjacent to therein and having a third bonding pad formed on an upper surface thereof electrically connected to a second connection electrode that passes through a portion of the insulation member; and
- a redistribution structure including a first redistribution, a second redistribution, and a third distribution each electrically connected to the first bonding pad, the first connection electrode, and the second connection electrode,
- wherein the upper surfaces of the second and the third semiconductor chips are directly contact with the lower surface of the first semiconductor chip, wherein the first redistribution, the second redistribution, and the third distribution are placed on the same plane.

8. The stacked wafer level package according to claim 7, wherein the second and the third bonding pads are disposed at a center region of the upper surface of the second and the third semiconductor chips respectively.

9. The stacked wafer level package according to claim 7, wherein the second and third bonding pads are disposed at an edge region of the upper surface of the second and the third semiconductor chips respectively.

10. The stacked wafer level package according to claim 7, wherein the redistribution structure includes:
- a first insulation layer pattern covering the first semiconductor chip and the insulation member, and having first openings for exposing the first bonding pad and the first and the second connection electrodes;
- the first redistribution disposed over the first insulation layer pattern and electrically connected with the first bonding pad through the respective first opening of the first insulation layer;
- the second redistribution disposed over the first insulation layer pattern and electrically connected with the first connection electrode through the respective first opening of the first insulation layer;
- the third redistribution disposed over the first insulation layer pattern and electrically connected with the second connection electrode through the respective first opening of the first insulation layer; and
- a second insulation layer pattern disposed over the first insulation layer pattern and the first through third redistributions and having second openings for exposing portions of the first through third redistributions.

11. The stacked wafer level package according to claim 7, wherein at least one of the first through third semiconductor chips is of a different type of semiconductor chip from the others.

* * * * *